United States Patent [19]

Han et al.

[11] Patent Number: 5,793,058
[45] Date of Patent: Aug. 11, 1998

[54] MULTI-GATE OFFSET SOURCE AND DRAIN FIELD EFFECT TRANSISTORS AND METHODS OF OPERATING SAME

[75] Inventors: Min-Koo Han, Seoul; Byung-Hyuk Min, Kyungki-do; Cheol-Min Park, Seoul; Keun-Ho Jang, Seoul; Jae-Hong Jun, Seoul, all of Rep. of Korea

[73] Assignee: Samsung Electronics Co., Ltd., Suwon, Rep. of Korea

[21] Appl. No.: 692,924

[22] Filed: Jul. 31, 1996

[30] Foreign Application Priority Data

Feb. 3, 1996 [KR] Rep. of Korea ............... 2634/1996

[51] Int. Cl.$^6$ .................................................. H01L 29/788
[52] U.S. Cl. ..................... 257/66; 257/270; 257/347; 257/365; 257/315
[58] Field of Search ........................... 257/270, 342, 257/347, 365, 366, 66, 315, 316

[56] References Cited

U.S. PATENT DOCUMENTS

| | | | |
|---|---|---|---|
| 4,319,263 | 3/1982 | Rao | 257/365 |
| 4,945,067 | 7/1990 | Huang | 257/365 |
| 5,124,769 | 6/1992 | Tanaka et al. | 257/366 |
| 5,198,379 | 3/1993 | Adan | 437/41 |
| 5,208,476 | 5/1993 | Inoue | 257/408 |
| 5,235,189 | 8/1993 | Hayden et al. | 257/329 |
| 5,250,835 | 10/1993 | Izawa | 257/408 |
| 5,410,172 | 4/1995 | Koizumi et al. | 257/347 |
| 5,430,320 | 7/1995 | Lee | 257/412 |
| 5,440,158 | 8/1995 | Sung-Mu | 257/316 |
| 5,446,304 | 8/1995 | Sameshima et al. | 257/365 |
| 5,488,005 | 1/1996 | Han et al. | 437/41 |
| 5,511,036 | 4/1996 | Farb et al. | 257/316 |
| 5,521,107 | 5/1996 | Yamazaki et al. | 437/42 |
| 5,548,132 | 8/1996 | Batra et al. | 257/66 |
| 5,581,102 | 12/1996 | Kusumoto | 257/347 |

FOREIGN PATENT DOCUMENTS

| | | | |
|---|---|---|---|
| 4-076955 | 3/1992 | Japan | 257/315 |
| 5-226662 | 9/1993 | Japan | 257/316 |

OTHER PUBLICATIONS

Park et al., "Self–Aligned Offset Gated Poly–Si TFTs by Employing a Photo Resistor Reflow Process", Extended Abstracts of the 1995 International Conference on Solid State Devices and Materials, Osaka, 1995, pp. 656–658.

Primary Examiner—David B. Hardy
Attorney, Agent, or Firm—Myers Bigel Sibley & Sajovec

[57] ABSTRACT

A field effect transistor includes laterally spaced apart source and drain regions in a substrate, laterally spaced apart undoped regions in the substrate between the laterally spaced apart source and drain regions, a doped channel region in the substrate between the laterally spaced apart undoped regions, and a gate insulating layer on the substrate. A main gate is on the gate insulating layer opposite the channel, and first and second sub gates are on the gate insulating layer, a respective one of which is opposite a respective one of the spaced apart undoped regions. The first and second sub gates are laterally spaced apart from and electrically insulated from the main gate. The transistor may be formed by patterning a photoresist layer and a gate layer to form a main gate and first and second sub gates, reflowing the photoresist into the lateral space between the main gate and the first and second sub gates, etching the gate insulating layer using the reflowed photoresist as a mask, and implanting ions into the substrate to form source and drain regions using the etched gate insulating layer as a mask.

19 Claims, 7 Drawing Sheets

MULTI-GATE OFFSET SOURCE AND DRAIN FIELD EFFECT TRANSISTORS AND METHODS OF OPERATING SAME

FIELD OF THE INVENTION

This invention relates to microelectronic devices and fabrication methods, and more particularly to microelectronic field effect transistors and fabrication methods.

BACKGROUND OF THE INVENTION

Microelectronic field effect transistors are widely used in integrated circuits including microprocessors, logic devices, memory devices and other integrated circuits. As is well known to those having skill in the art, a Metal Oxide Semiconductor Field Effect Transistor (MOSFET) generally includes laterally spaced apart source and drain regions in a substrate, with a channel region therebetween, a gate insulating layer on the channel and a gate on the gate insulating layer opposite the channel.

Field effect transistor performance may be measured by the ratio of on current to off current. On current refers to the current flowing between the source region and the drain region when the transistor is in an on state. On current is also referred to as "saturation current". Off current is the current which flows between the source and drain regions when the transistor is in an off state. Off current is also referred to as "leakage current". It is desirable for a field effect transistor to have a large on current in order to increase switching speed. A small off current is also desirable, so that the transistor consumes low power and may be used with low voltages. Accordingly, it is desirable for the field effect transistor to have a large on/off current ratio, so that the on current is large and the off current is small. Unfortunately, it is difficult to control the off current or leakage current in a conventional field effect transistor. Moreover, well known "hot electron" effects also increase the off current.

In order to solve these and other problems, Lightly Doped Drain (LDD) structures and offset gate structures have been utilized in field effect transistors. A lightly doped drain transistor is described in U.S. Pat. No. 5,198,379 to Adan entitled "Method of Making a MOS Thin Film Transistor With Self-Aligned Asymmetrical Structure". An offset gate field effect transistor is described in U.S. Pat. No. 5,208,476 to Inoue entitled "Low Leakage Current Offset-Gate Thin Film Transistor Structure".

Figure 1A:
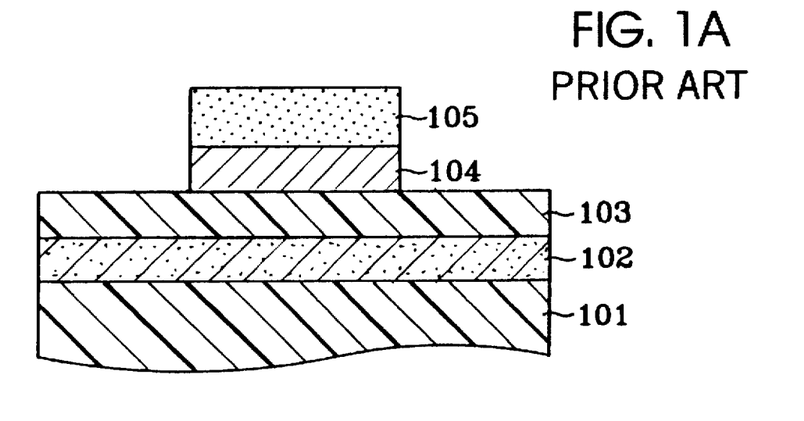
FIGS. 1A–1F are cross-sectional views of a conventional offset structure thin film field effect transistor during intermediate fabrication steps.

FIGS. 1A–1F are cross-sectional views of a conventional offset thin film field effect transistor during intermediate fabrication steps. Referring to FIG. 1A, a thin polycrystalline silicon (polysilicon) or amorphous silicon film 102 is formed on a substrate 101 such as a quartz, glass, sapphire or other substrate. A gate-insulating layer 103 such as silicon dioxide is formed on the thin silicon film 102. A gate 104 comprising doped polysilicon, metal or an electrically conductive thin film (ITO) is formed on the gate insulating layer 103. A photoresist layer 105 is formed on the gate electrode 104.

Figure 1B:
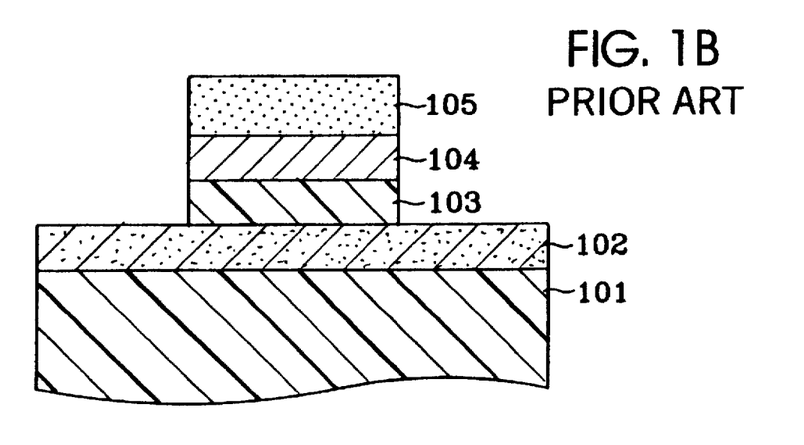
Figure 1C:
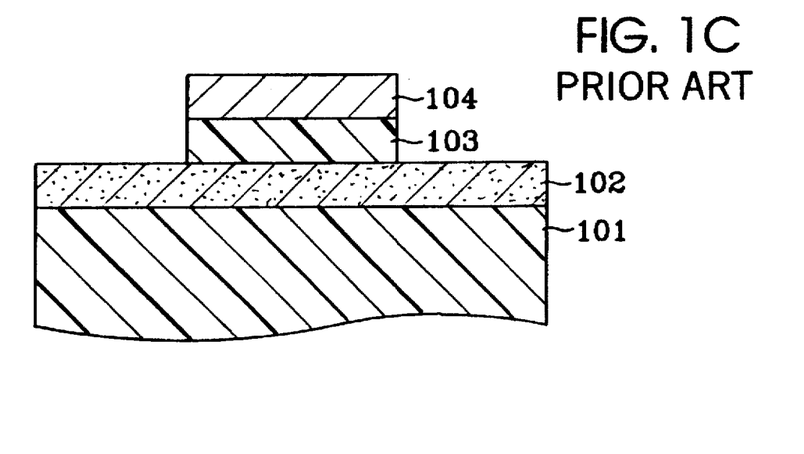

As shown in FIG. 1B, gate insulating film 103 is etched using the photoresist layer 105 and the gate electrode 104 as a mask. As shown in FIG. 1C, the photoresist 105 is removed.

Figure 1D:
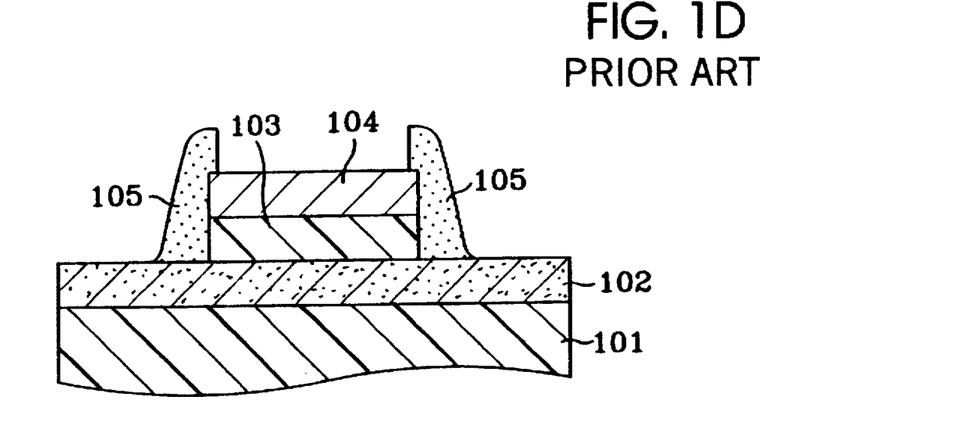

As shown in FIG. 1D, a photoresist pattern 105 is then formed on both sidewalls of the gate electrode 104. The lateral thickness of the sidewalls 105 on the thin film 102 will correspond to the lateral thickness of offset regions which are formed in the thin film 102 as described in FIG. 1E.

Figure 1E:
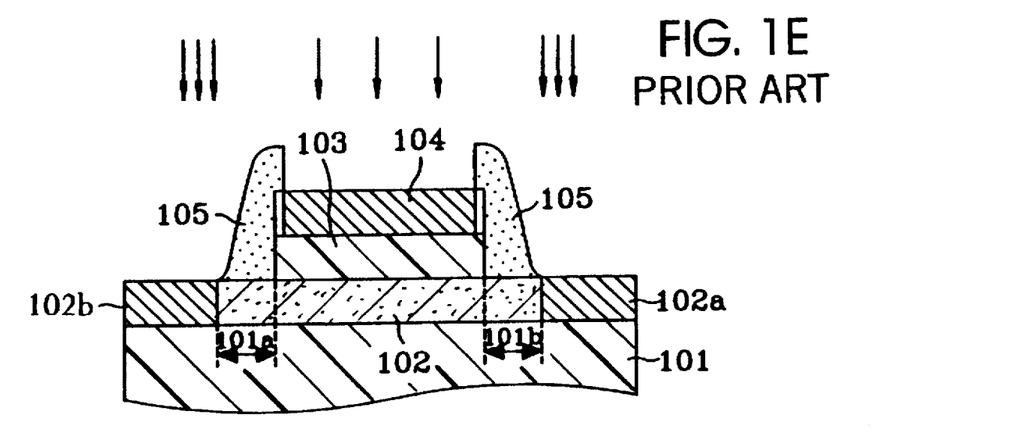
Figure 1F:
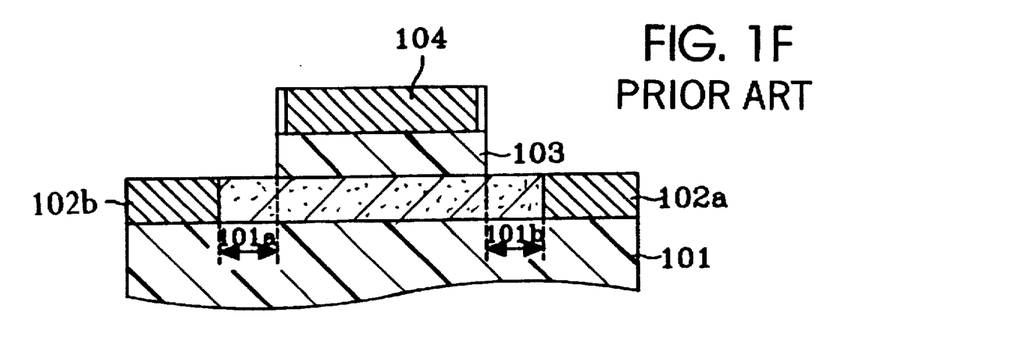

As shown in FIG. 1E, ion implantation is performed to form the offset regions 101a and 101b, a source region 102b and a drain region 102a. As shown in FIG. 1F, photoresist sidewalls 105 are then removed.

Unfortunately, in the above fabrication method, the need to form a second photoresist layer in FIG. 1D may require an additional masking step. Moreover, the lengths of the offset regions 110a and 101b may be different, which may thereby cause an asymmetrical electrical characteristic in the field effect transistor.

Figure 2A:
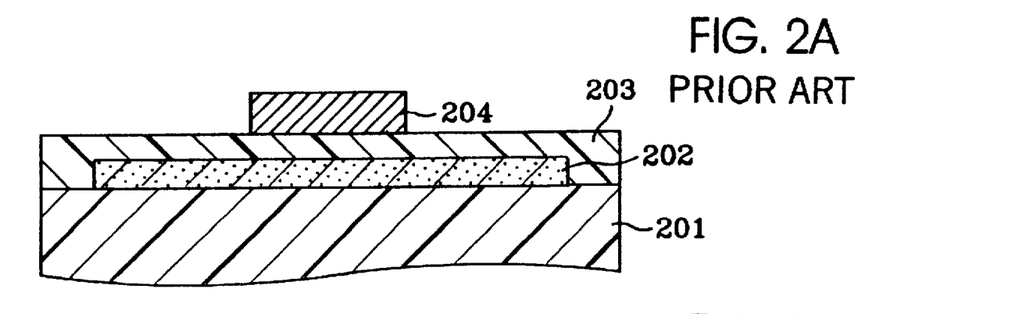
FIGS. 2A–2D are cross-sectional views of a conventional thin film field effect transistor having lightly doped drains during intermediate fabrication steps.

FIGS. 2A–2D are cross-sectional views illustrating a conventional thin film structure which employs a lightly doped drain, during intermediate fabrication steps. In FIG. 2A, a thin polysilicon or amorphous silicon film 202 is formed on an insulating substrate 201 such as quartz, glass, sapphire or the like. A gate insulating film 203 such as a silicon dioxide film, is formed on the thin silicon film 202 opposite the substrate 201. A gate electrode, for example of metal, insulated thermal oxide or polysilicon, is patterned on gate insulating layer 203.

Figure 2B:
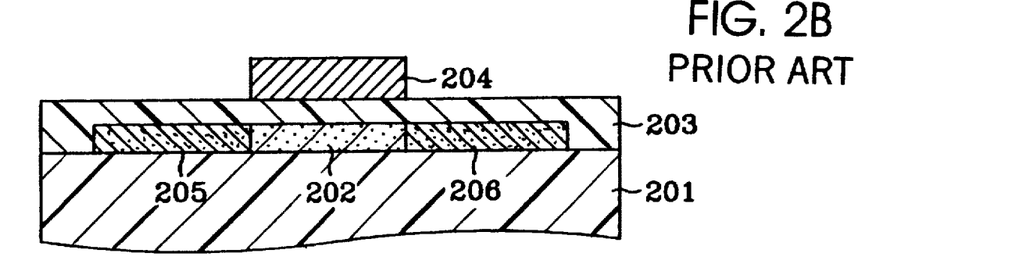
Figure 2C:
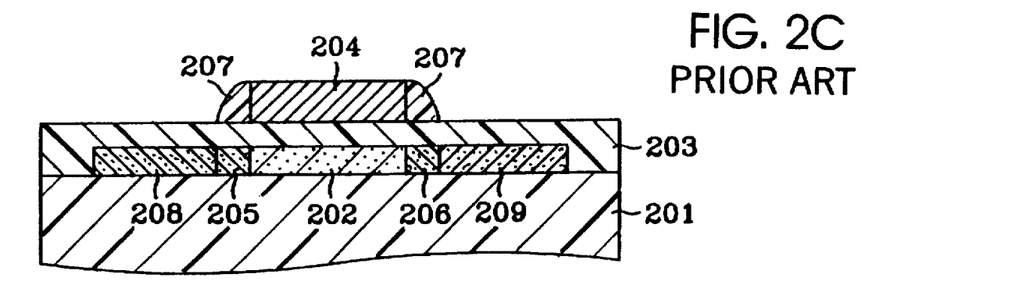

As shown in FIG. 2B, lightly doped source and drain regions 205 and 206 are formed in a self-aligned manner using the gate electrode as a mask. For example, ion implantation of donor and acceptor dopants may be used at a concentration of about $1 \times 10^{14}$ cm$^{-2}$. Then, as shown in FIG. 2C, an insulating layer is formed and anisotropically etched to form insulating sidewall spacers 207 on the sidewalls of the gate electrode 204. Source and drain regions 208 and 209 may then be formed, self-aligned to the gate electrode 204, by ion implanting donor or acceptor dopants at a concentration of about $1 \times 10^{15}$ cm$^{-2}$, using the gate electrode 204 and the sidewall spacers 207 as a mask. Accordingly, lightly doped source and drain regions 205 and 206 remain under the sidewall spacers 207.

Figure 2D:
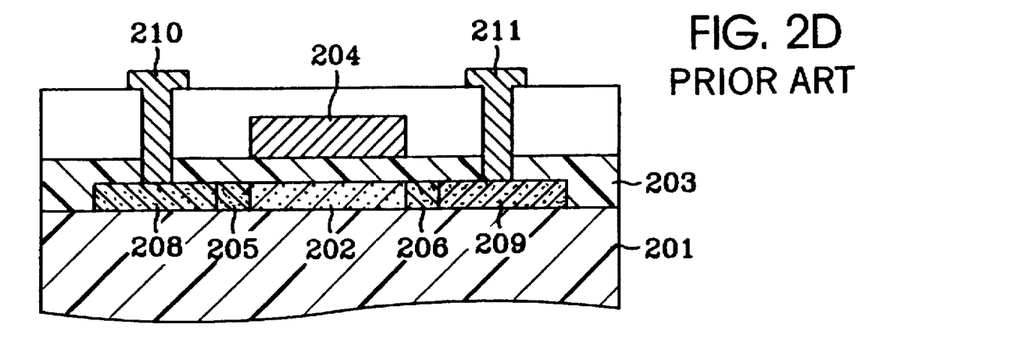

As shown in FIG. 2D, source and drain electrodes 210 and 211 respectively are connected to the source and drain regions 208 and 209 respectively.

Unfortunately, the thin film transistor of FIGS. 2A–2D may require additional masking steps and additional ion implantation steps, thereby complicating the fabrication thereof. Accordingly, despite the advances of lightly doped drain and laterally offset transistors, there is still a need for field effect transistors, and especially thin film field effect transistors, which are capable of large on/off current ratios, and which do not require complicated fabrication steps.

SUMMARY OF THE INVENTION

It is therefore an object of the invention to provide improved integrated circuit field effect transistors and methods of fabricating same.

It is another object of the present invention to provide improved thin film integrated circuit field effect transistors and methods of fabricating same.

It is yet another object of the present invention to provide integrated circuit field effect transistors which are capable of large on/off current ratios, and methods of fabricating same.

It is yet another object of the present invention to provide integrated circuit field effect transistors and methods of fabricating same which do not require extra masking steps or extra ion implantation steps.

It is still another object of the present invention to provide field effect transistors which can be fabricated symmetrically using self-aligned methods.

These and other objects are provided, according to the present invention, by forming a thin film including polycrystalline silicon or amorphous silicon on a substrate, forming a gate insulating layer on the thin film, forming a gate layer on the gate insulating layer and coating a photoresist layer on the gate layer. The photoresist layer and the gate layer are patterned to form a main gate and first and second sub gates which are laterally spaced apart from the main gate, on opposite sides thereof. The main gate and the first and second sub gates include photoresist thereon. The photoresist is reflowed into the lateral space between the main gate and the first and second sub gates, and laterally beyond the first and second sub gates. The gate insulating layer is then etched using the reflowed photoresist as a mask. Ions are implanted into the thin film to form source and drain regions using the etched gate insulating layer as a mask. Accordingly, field effect transistors having a main gate and at least one sub gate and laterally offset source and drain regions is formed.

Field effect transistors according to the invention, include laterally spaced apart source and drain regions in a substrate, for example in a layer comprising polycrystalline silicon or amorphous silicon, and laterally spaced apart undoped regions in the substrate between the laterally spaced apart source and drain regions, and a channel region in the substrate between the laterally spaced apart undoped regions. A gate insulating layer is located on the substrate. A main gate is on the gate insulating layer, opposite the channel. First and second sub gates are on the gate insulating layer. A respective one of the first and second sub gates is opposite a respective one of the spaced apart undoped regions. The first and second sub gates are laterally spaced apart from and electrically insulated from the main gate. The gate insulating layer preferably extends laterally on the substrate adjacent the channel region and adjacent the laterally spaced apart undoped regions, but does not extend laterally adjacent the laterally spaced apart source and drain regions.

Accordingly, field effect transistors, preferably think film field effect transistors are formed, which are capable of high saturation current and low leakage current, which may only require a single ion implantation step and which may be formed in a self-aligned manner to provide symmetrical transistors.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as p- or n-type, however, each embodiment described and illustrated herein includes its complementary embodiment as well.

In the description which follows, fabrication methods for a thin film transistor according to the present invention are illustrated. However, it will be understood that the present invention is also applicable to MOS transistors formed in bulk substrate material. Moreover, although multiple sub gates are shown, a single sub gate may also be used.

FIGS. 3A–3E are cross-sectional views of an embodiment of a multi-gate, offset source and drain field effect transistor according to the present invention during intermediate fabrication steps.

Figure 3A:
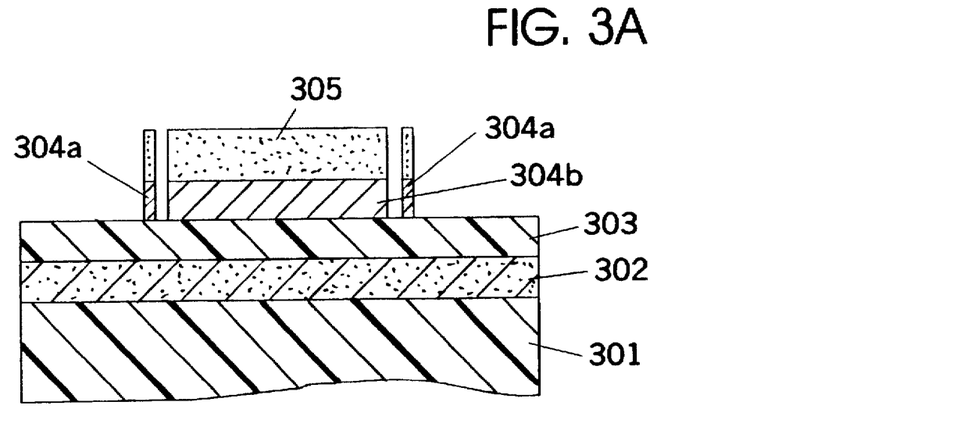
FIGS. 3A–3E are cross-sectional views of a multi-gate, offset source and drain field effect transistor according to the present invention during intermediate fabrication steps.

Referring now to FIG. 3A, a thin film 302, including for example amorphous silicon or polycrystalline silicon, is formed on a substrate 301, such as an insulating substrate or other substrate. A gate insulating layer 303 such as a 100 nm thick silicon dioxide film, is formed on thin film 302. Other insulators, such as silicon nitride or multilayer insulators may be formed. A gate electrode 304 such as a 200 nm thick layer of metal, Insulated Thermal Oxide (ITO) or doped polysilicon, is formed on gate insulating layer 303, for example using Low Pressure Chemical Vapor Deposition (LPCVD). A layer of reflowable material such as photoresist 305, is formed on gate layer 304.

Patterning, using conventional photolithography or other conventional techniques, is then performed on gate layer 304 and photoresist layer 305 to thereby pattern the gate electrode 304 into a main gate electrode 304b and first and second sub gate electrodes 304a. As shown in FIG. 3A, the main gate 304b and the sub gates 304a include photoresist 305 thereon. However, they need not all include photoresist thereon. It will be understood that patterning of gate 304 may also be performed using reactive ion etching or other conventional techniques.

Figure 3B:
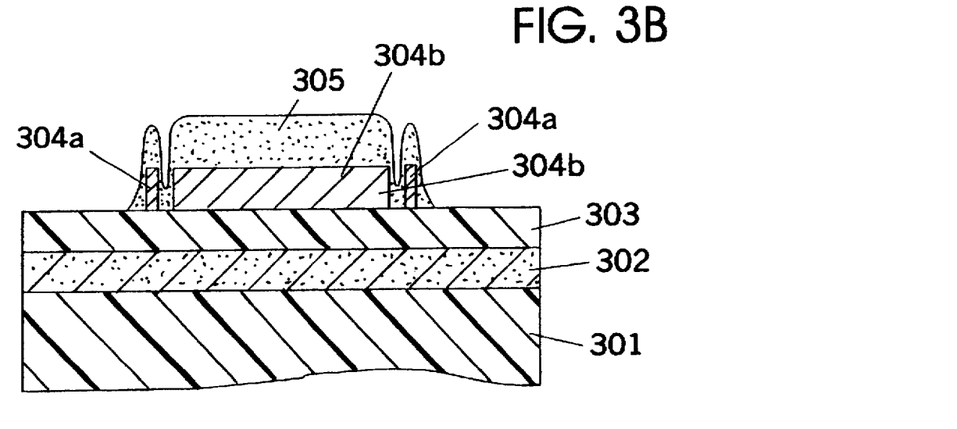

Referring now to FIG. 3B, the photoresist 305 on the main gate 304b and the sub gate 304 is reflowed. Reflow may take place at 160° C. for thirty minutes. As shown in FIG. 3B, reflow of the photoresist 305 causes the photoresist to flow into the lateral space between the main gate 304b and the first and second sub gates 304a. Photoresist also preferably reflows laterally beyond the first and second sub gates 304a.

Figure 3C:
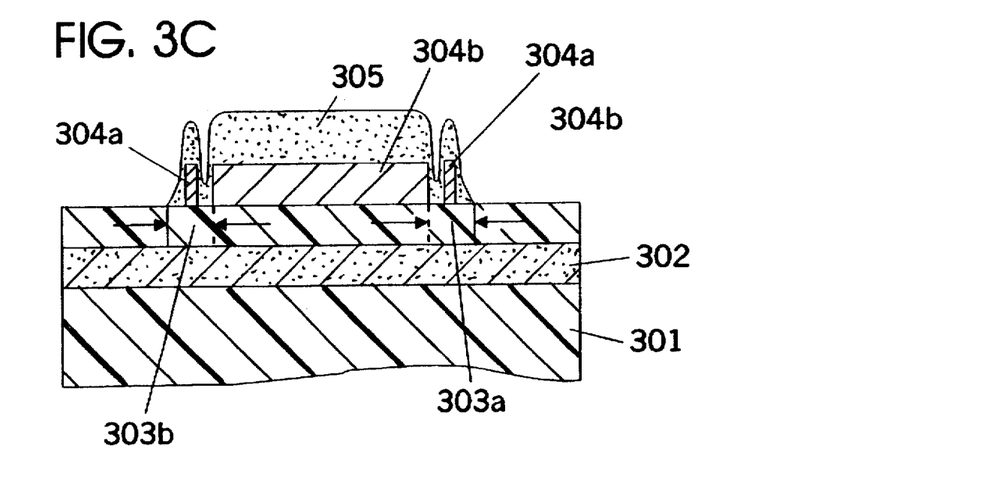
Figure 3D:
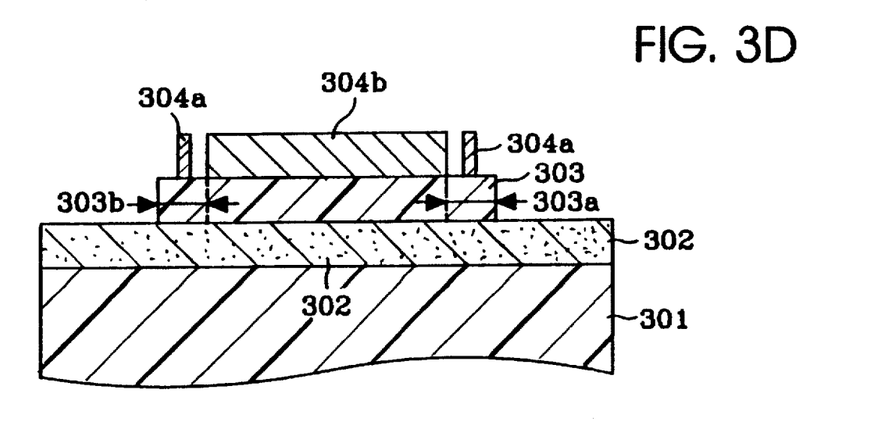

Referring now to FIG. 3C, the gate insulating layer 303 is patterned using the reflowed photoresist 305 as a mask. The reflowed photoresist 305 may then be removed.

Accordingly, the reflowed photoresist 305 acts as a mask between the main gate 304b and the sub gate 304a. As a result, insulated offset regions 303a and 303b remain in the gate insulating layer.

Figure 3E:
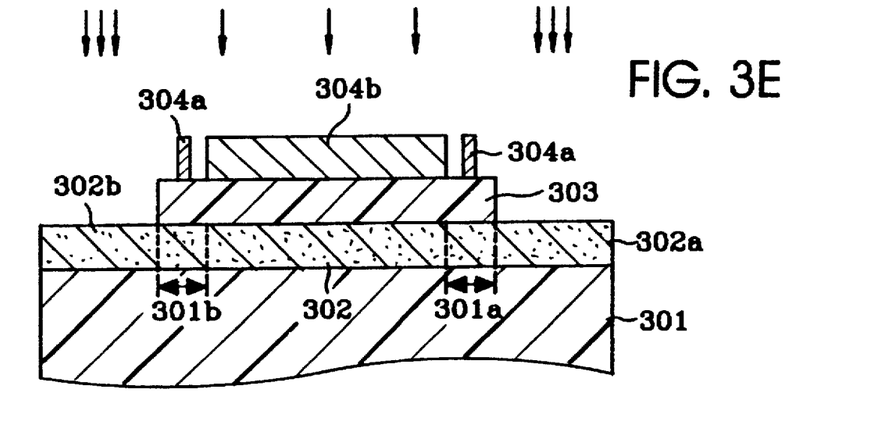

As shown in FIG. 3E, ion implantation is performed into thin film 302, self-aligned to the main gate 304b, the sub gate 304a and the insulated offset regions 303a and 303b. Source and drain regions 302a and 302b are thereby formed in the thin film 302. Undoped offset regions 301a and 301b are also formed in the thin film 302.

Figure 4A:
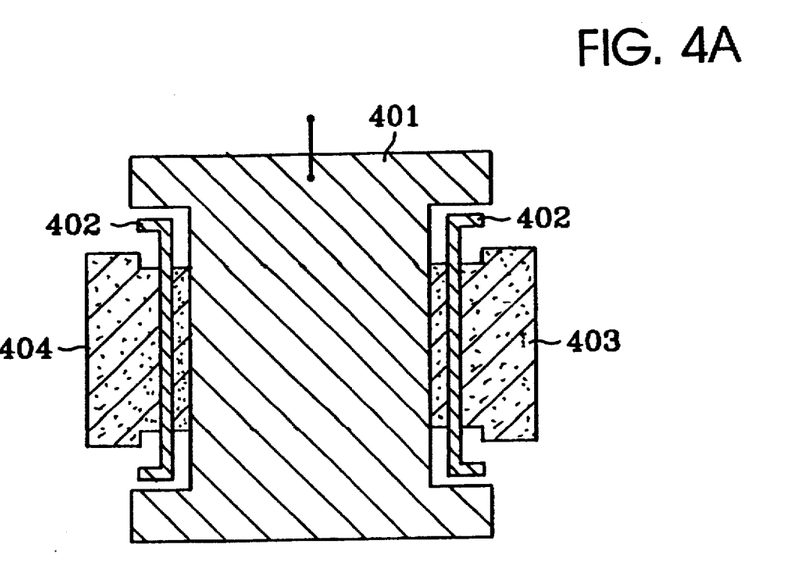
FIGS. 4A and 4B are a top view and a cross-sectional view of a multi-gate, offset source and drain field effect transistor according to the present invention.
Figure 4B:
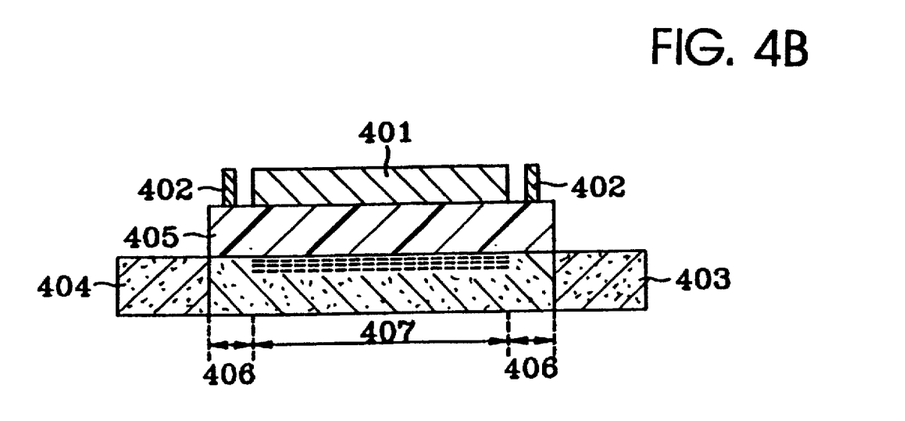

FIGS. 4A and 4D are a top view and a cross-sectional view of the field effect transistor of FIG. 3E. As shown in FIGS. 4A and 4B, laterally spaced apart source and drain regions 404 and 403 respectively are formed at the left and right sides of the polycrystalline silicon channel region 407. The main gate electrode 401 and the sub gate electrodes 402 are laterally spaced apart on gate insulating layer 405. The gate insulating layer 405 laterally extends on channel 407 and on offset regions 406, but preferably does not extend laterally on source and drain regions 404 and 403 respectively. Accordingly, when the gate is etched, the gate insulating layer between the main gate electrode 401 and the sub gate electrode 402 is not etched due to the presence of the reflowed photoresist. Laterally spaced apart undoped regions are thereby formed in the substrate between the laterally spaced apart source and drain regions. The undoped regions are formed by the self-aligned ion implantation of the source and drain regions 403 and 404.

Field effect transistors according to the invention include laterally spaced apart source and drain regions 404 and 403 in a substrate, laterally spaced apart undoped regions 406 and 407 in the substrate between the laterally spaced apart source and drain regions, and a channel region 407 in the substrate between the laterally spaced apart undoped regions. A gate insulating layer 405 is on the substrate. A main gate 401 is on the gate insulating layer opposite the channel. First and second sub gates 402 are on the gate insulating layer, a respective one of which is opposite a respective one of the spaced apart undoped regions 406. The first and second sub gates are laterally spaced apart from and electrically insulated from the main gate.

The substrate may comprise a layer including polycrystalline silicon or amorphous silicon, and the laterally spaced apart source and drain regions, the laterally spaced apart undoped regions and the channel region may be formed in the layer of polycrystalline silicon or amorphous silicon. As also illustrated in FIG. 4, the gate insulating layer 405 preferably extends laterally on the substrate adjacent the channel region 407 and adjacent the laterally spaced apart undoped regions 406, but does not extend laterally adjacent the laterally spaced apart source region 404 and drain region 403.

It will also be understood that the first and second sub gates may be electrically connected to one another, but are electrically isolated from main gate 401. As shown in FIG. 4A, main gate 401 may be electrically connected to other field effect transistors in the integrated circuit while sub gates 402 remain electrically floating. As also shown in FIGS. 4A and 4B, the main gate 401 has a lateral width which is the same as the channel region 407, and the sub gates 402 each have lateral width which is the same as the laterally spaced apart undoped regions 406.

Figure 5:
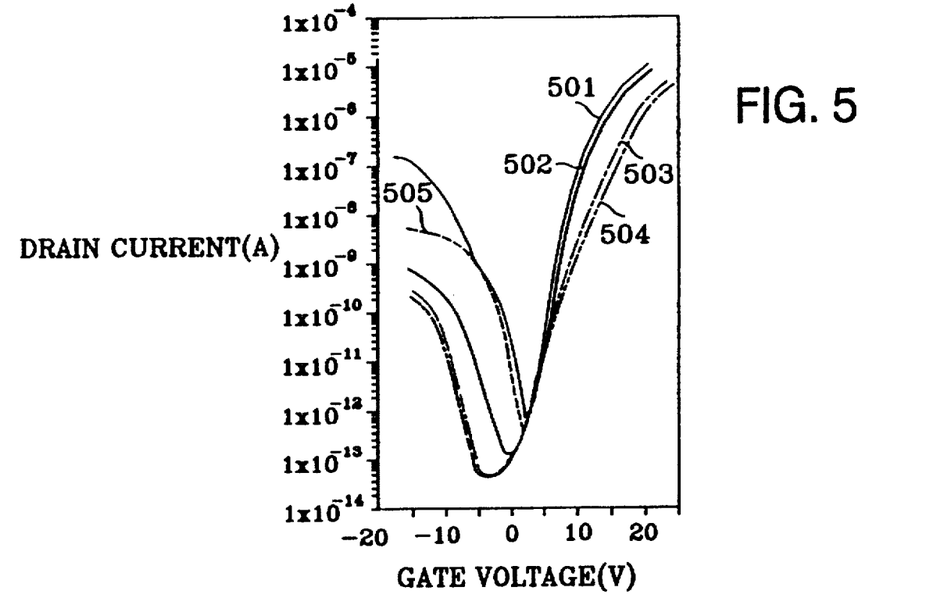
FIG. 5 graphically illustrates drain current as a function of gate voltage for a multi-gate, offset source and drain field effect transistor according to the present invention.

FIG. 5 graphically illustrates drain current as a function of gate voltage for a field effect transistor according to the present invention. The channel length is 10 μm. Line 501 illustrates no offset. Lines 505, 502, 503 and 504 represent offset lengths of 0.3 μm, 0.5 μm, 0.8 μm and 1.0 μm respectively. As used herein, "offset length" represents an effective offset length which takes into account ion diffusion in the source and drain regions. The ion diffusion length is about 0.2 μm as determined by a process simulator which simulates an anneal and activation of ions injected into the source and drain regions at 900° C. for thirty minutes. As shown in FIG. 5, as the offset length of the transistor is increased, the on and off currents both decrease due to the charge in the undoped region between the source and drain regions and the gate, but the off current decreases more than the on current.

Figure 6:
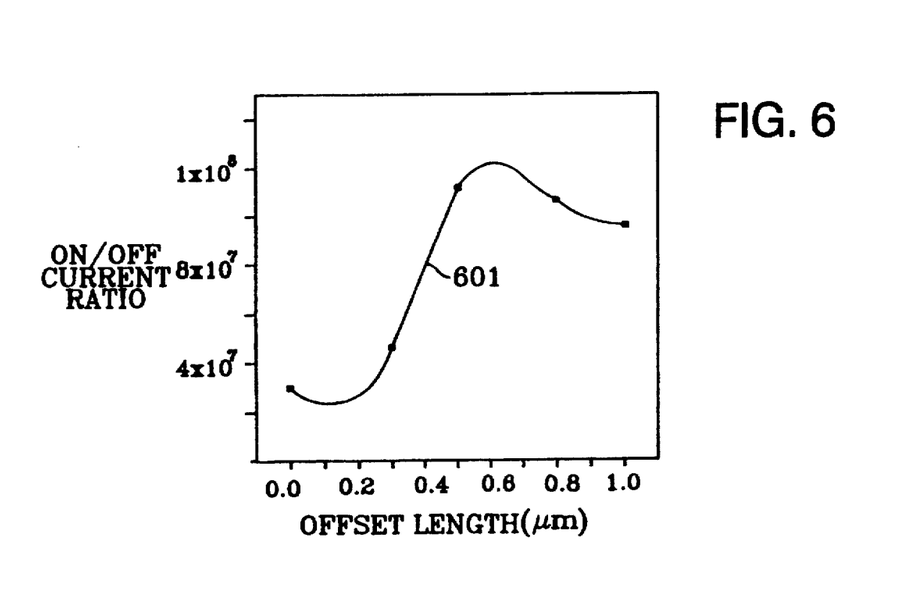
FIG. 6 graphically illustrates on/off current ratio as a function of offset length for a field effect transistor according to the present invention.

FIG. 6 graphically illustrates an on/off current ratio as a function of the offset length according to the present invention. As shown, the off current value is reduced from 0.4 pA to 30 fA as the offset length varies from 0 μm to 1 μm, so that the on/off current ratio is improved as shown at line 601.

In summary, offset transistors according to the present invention may have a uniform electrical characteristic and may form a uniform offset region without requiring an additional offset mask as in a conventional offset transistor. Moreover, as the offset length is increased, the leakage current is reduced and the on/off current ratio is improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A field effect transistor comprising:

laterally spaced apart source and drain regions in a substrate;

laterally spaced apart undoped regions in said substrate, between said laterally spaced apart source and drain regions;

a channel region in said substrate, between said laterally spaced apart undoped regions;

a gate insulating layer on said substrate;

a main gate on said gate insulating layer, opposite said channel region; and first and second floating sub gates on said gate insulating layer, a respective one of which is opposite a respective one of said spaced apart undoped regions, said first and second floating sub gates being laterally spaced apart from said main gate and being electrically floating.

2. A field effect transistor according to claim 1 wherein said substrate includes a layer comprising polycrystalline silicon or amorphous silicon, and wherein said laterally spaced apart source and drain regions, said laterally spaced apart undoped regions and said channel region are in said layer comprising polycrystalline silicon or amorphous silicon, and wherein said gate insulating layer is on said layer comprising polycrystalline silicon or amorphous silicon.

3. A field effect transistor according to claim 2 wherein said gate insulating layer extends laterally on said channel region and on said laterally spaced apart undoped regions, but does not extend laterally on said laterally spaced apart source and drain regions.

4. A field effect transistor comprising:

laterally spaced apart source and drain regions in a substrate and a channel region in said substrate therebetween;

a gate insulating layer on said substrate;

a main gate on said gate insulating layer, opposite said channel region; and first and second floating sub rates on said gate insulating layer, said first and second floating sub gates being laterally spaced apart from said main gate and being electrically floating;

wherein said substrate includes a layer comprising polycrystalline silicon or amorphous silicon, wherein said laterally spaced apart source and drain regions and said channel region are in said layer comprising polycrystalline silicon or amorphous silicon, and wherein said gate insulating layer is on said layer comprising polycrystalline silicon or amorphous silicon.

5. A field effect transistor comprising:

laterally spaced apart source and drain regions in a substrate, and a channel region in said substrate therebetween, a gate insulating layer on said substrate;

a main gate on said gate insulating layer, opposite said channel region; and first and second floating sub gates on said gate insulating layer, said first and second floating sub gates being laterally spaced apart from said main gate and being electrically floating;

wherein said gate insulating layer extends laterally on said channel region, but does not extend laterally on said laterally spaced apart source and drain regions.

6. A field effect transistor comprising:

a thin film including laterally spaced apart source and drain regions therein, laterally spaced apart undoped regions therein, between said laterally spaced apart source and drain regions, and a channel region therein, between said laterally spaced apart undoped regions;

a gate insulating layer on said thin film;

a main gate on said gate insulating layer, opposite said channel region; and a floating sub gate on said gate insulating layer, opposite one of said laterally spaced apart undoped regions, said floating sub gate being laterally spaced apart from said main gate and being electrically floating.

7. A field effect transistor according to claim 6 further comprising:

a second floating sub gate on said gate insulating layer opposite the other of said laterally spaced apart undoped regions, said second sub gate being laterally spaced apart from said main gate and from said floating sub gate, said second floating sub gate being electrically floating.

8. A field effect transistor according to claim 7 wherein said thin film includes polycrystalline silicon or amorphous silicon.

9. A field effect transistor according to claim 8 wherein said gate insulating layer extends laterally on said channel region and extends laterally on said laterally spaced apart undoped regions, but does not extend laterally on said laterally spaced apart source and drain regions.

10. A field effect transistor according to claim 9 wherein said main gate has lateral width which is same as said channel region and wherein said sub gate and said second sub gate each have lateral width which is same as said laterally spaced apart undoped regions.

11. A field effect transistor comprising:

a thin film including laterally spaced apart source and drain regions therein and a channel region therein between said laterally spaced apart source and drain regions;

a gate insulating layer on said thin film;

a main gate on said gate insulating layer, opposite said thin film; and a floating sub gate region on said gate insulating layer, said floating sub gate again being laterally spaced apart from said main gate and being electrically floating.

12. A field effect transistor according to claim 11 further comprising:

a second floating sub gate on said gate insulating layer and laterally spaced apart from said main gate, said second floating sub gate being laterally spaced apart from said main gate and said floating sub gate, said second floating sub gate being electrically floating.

13. A field effect transistor according to claim 12 wherein said thin film includes polycrystalline silicon or amorphous silicon.

14. A method of operating a field effect transistor comprising laterally spaced apart source and drain regions in a substrate; laterally spaced apart undoped regions in said substrate, between said laterally spaced apart source and drain regions; a channel region in said substrate, between said laterally spaced apart undoped regions; a gate insulating layer on said substrate; a main gate on said gate insulating layer, opposite said channel region; and first and second sub gates on said gate insulating layer, a respective one of which is opposite a respective one of said spaced apart undoped regions, said first and second sub gates being laterally spaced apart from, and electrically insulated from, said main gate; said operating method comprising the step of:

applying a signal to said main gate while maintaining said first and second sub gates electrically floating.

15. A method according to claim 14 wherein said substrate includes a layer comprising polycrystalline silicon or amorphous silicon, and wherein said laterally spaced apart source and drain regions, said laterally spaced apart undoped regions and said channel region are in said layer comprising polycrystalline silicon or amorphous silicon, and wherein said gate insulating layer is on said layer comprising polycrystalline silicon or amorphous silicon.

16. A method of operating a field effect transistor comprising laterally spaced apart source and drain regions in a substrate, and a channel region in said substrate therebetween; a gate insulating layer on said substrate; a main gate on said gate insulating layer, opposite said channel region; and first and second sub gates on said gate insulating layer, said first and second sub gates being electrically insulated from, and laterally spaced apart from, said main gate, said operating method comprising the step of:

applying a signal to said main gate while maintaining said first and second sub gates electrically floating wherein said substrate includes a layer comprising polycrystalline silicon or amorphous silicon, wherein said laterally spaced apart source and drain regions and said channel region are in said layer comprising polycrystalline silicon or amorphous silicon, and wherein said gate insulating layer is on said layer comprising polycrystalline silicon or amorphous silicon.

17. A method of operating a field effect transistor comprising a thin film including laterally spaced apart source and drain regions therein, laterally spaced apart undoped regions therein, between said laterally spaced apart source and drain regions, and a channel region therein, between said laterally spaced apart undoped regions; a gate insulating layer on said thin film; a main gate on said gate insulating layer, opposite said channel region; and a sub gate on said gate insulating layer, opposite one of said laterally spaced apart undoped regions, said sub gate being laterally spaced apart from, and electrically insulated from, said main gate, said operating method comprising the step of:

applying a signal to said main gate while maintaining said first and second sub gates electrically floating.

18. A method according to claim 17 wherein said thin film includes polycrystalline silicon or amorphous silicon.

19. A method of operating a field effect transistor comprising a thin film including laterally spaced apart source and drain regions therein and a channel region therein between said laterally spaced apart source and drain regions; a gate insulating layer on said thin film; a main gate on said gate insulating layer, opposite said thin film; and a sub gate region on said gate insulating layer, said sub gate being laterally spaced apart from, and electrically insulated from said main gate, said operating method comprising the step of:

applying a signal to said main gate while maintaining said sub gate region electrically floating.

* * * * *